(12) United States Patent
Takahashi

(10) Patent No.: US 9,947,550 B2
(45) Date of Patent: Apr. 17, 2018

(54) FILM FORMING METHOD AND METHOD OF MANUFACTURING THIN FILM TRANSISTOR

(71) Applicant: NISSIN ELECTRIC CO., LTD., Kyoto (JP)

(72) Inventor: Eiji Takahashi, Kyoto (JP)

(73) Assignee: NISSIN ELECTRIC CO., LTD., Kyoto (JP)

( * ) Notice: Subject to any disclaimer, the term of this patent is extended or adjusted under 35 U.S.C. 154(b) by 0 days.

(21) Appl. No.: 15/549,666

(22) PCT Filed: Feb. 1, 2016

(86) PCT No.: PCT/JP2016/052943
§ 371 (c)(1),
(2) Date: Aug. 9, 2017

(87) PCT Pub. No.: WO2016/129438
PCT Pub. Date: Aug. 18, 2016

(65) Prior Publication Data
US 2018/0033644 A1    Feb. 1, 2018

(30) Foreign Application Priority Data
Feb. 13, 2015 (JP) ................. 2015-026255

(51) Int. Cl.
*H01L 21/02* (2006.01)
*H01L 21/443* (2006.01)
(Continued)

(52) U.S. Cl.
CPC ............ *H01L 21/443* (2013.01); *C23C 16/02* (2013.01); *C23C 16/345* (2013.01); *C23C 16/50* (2013.01);
(Continued)

(58) Field of Classification Search
CPC ............ H01L 21/443; H01L 21/02274; H01L 21/02565; H01L 21/0262; H01L 21/477; H01L 21/0217
See application file for complete search history.

(56) References Cited

U.S. PATENT DOCUMENTS

2009/0184315 A1    7/2009 Lee et al.
2011/0284959 A1*  11/2011 Kimura ............... H01L 27/1225
                                                257/347
(Continued)

FOREIGN PATENT DOCUMENTS

JP    2013084725    5/2013
JP    5454727    3/2014

OTHER PUBLICATIONS

International Search Report (Form PCT/ISA/210) of PCT/JP2016/052943, dated Apr. 19, 2016, with English translation thereof, pp. 1-2.

*Primary Examiner* — Douglas Menz
(74) *Attorney, Agent, or Firm* — JCIPRNET

(57) ABSTRACT

Provided is a film forming method to minimize decreases in the electrical resistance of an oxide semiconductor film even when a fluorinated silicon nitride film is formed directly on the oxide semiconductor film. The film forming method includes: a surface treatment process in which a substance including an oxide semiconductor film on a substrate is prepared, plasma is generated using a mixed gas of oxygen and hydrogen which contains hydrogen at a rate of 8% or less (not including 0), and plasma is used to treat surface of oxide semiconductor film; a film formation process in which a fluorinated silicon nitride film (a SiN:F film) is subsequently forming on oxide semiconductor film by a plasma CVD method in which plasma is generated using a raw material gas containing silicon tetrafluoride gas and nitrogen (Continued)

gas; and an annealing process in which substrate and film thereon are subsequently heated.

6 Claims, 2 Drawing Sheets

(51) Int. Cl.
*C23C 16/02* (2006.01)
*C23C 16/56* (2006.01)
*C23C 16/50* (2006.01)
*C23C 16/34* (2006.01)
*H01L 29/786* (2006.01)
*H01L 21/477* (2006.01)
*H01L 29/66* (2006.01)

(52) U.S. Cl.
CPC .......... *C23C 16/56* (2013.01); *H01L 21/0217* (2013.01); *H01L 21/0262* (2013.01); *H01L 21/02274* (2013.01); *H01L 21/02565* (2013.01); *H01L 21/477* (2013.01); *H01L 29/66969* (2013.01); *H01L 29/7869* (2013.01)

(56) References Cited

U.S. PATENT DOCUMENTS

| | | | | |
|---|---|---|---|---|
| 2011/0309355 A1* | 12/2011 | Ichijo | ................. | H01L 29/4908 257/43 |
| 2012/0001168 A1* | 1/2012 | Ichijo | ................. | H01L 29/7869 257/43 |
| 2015/0228799 A1* | 8/2015 | Koezuka | ............... | H01L 27/124 257/43 |

* cited by examiner

FILM FORMING METHOD AND METHOD OF MANUFACTURING THIN FILM TRANSISTOR

CROSS-REFERENCE TO RELATED APPLICATION

This application is a 371 application of the international PCT application serial no. PCT/JP2016/052943, filed on Feb. 1, 2016, which claims the priority benefit of Japan application no. 2015-026255, filed on Feb. 13, 2015. The entirety of each of the above-mentioned patent applications is hereby incorporated by reference herein and made a part of this specification.

BACKGROUND OF THE INVENTION

Field of the Invention

The present invention relates to a method of forming a fluorinated silicon nitride film (SiN:F film) on an oxide semiconductor film and a method of manufacturing a thin film transistor using the method.

Description of Related Art

A film forming method in which a fluorinated silicon nitride film (SiN:F film) is directly formed on an oxide semiconductor film (for example, an IGZO film) or is formed thereon with another element interposed therebetween according to a plasma CVD method using a raw material gas containing silicon tetrafluoride gas ($SiF_4$) and nitrogen gas ($N_2$) is known (for example, refer to Patent Literature 1).

The fluorinated silicon nitride film has stable electrical insulating characteristics and is denser than a silicon oxide film ($SiO_2$) that is generally used as an insulating film in the related art. Therefore, it has a characteristic of effectively preventing diffusion of impurities.

CITATION LIST

Patent Literature

CITATION LIST

Patent Literature

SUMMARY OF THE INVENTION

Problem to be Solved by the Invention

In the film forming method of the related art described above, when a fluorinated silicon nitride film is directly formed on an oxide semiconductor film (that is, without an intervening element such as another film, the same hereinafter), there is a problem in that an electric resistance of the oxide semiconductor film is greatly reduced.

This is thought to be caused by the fact that oxygen in the oxide semiconductor film is reduced by fluorine contained in a raw material gas when the film is formed, oxygen deficiency occurs in the oxide semiconductor film, electrons are trapped in holes generated due to the oxygen deficiency, and the trapped electrons serve as donors and greatly reduce the electric resistance.

When the electric resistance of the oxide semiconductor film is greatly reduced, for example, a thin film transistor including the oxide semiconductor film does not exhibit a characteristic as a transistor.

Therefore, the invention provides a film forming method through which it is possible to prevent an electric resistance of an oxide semiconductor film from decreasing even if a fluorinated silicon nitride film is directly formed on the oxide semiconductor film.

In addition, the invention provides a method of manufacturing a thin film transistor using such a film forming method.

Technical Means Solving the Problem

A film forming method according to the invention includes following steps. A surface treatment process of preparing a substance in which an oxide semiconductor film is formed on a substrate, generating a plasma using a mixed gas of oxygen and hydrogen in which a proportion of hydrogen is 8% or less (not including 0), and treating a surface of the oxide semiconductor film with the plasma is performed. Then, a film forming process of forming a fluorinated silicon nitride film containing fluorine in a silicon nitride film on the oxide semiconductor film by a plasma CVD method in which a plasma is generated using a raw material gas containing silicon tetrafluoride gas and nitrogen gas is performed. And then, an annealing process of heating the substrate and the film thereon is performed.

According to the film forming method, oxygen and hydrogen appropriately enter a surface layer portion of the oxide semiconductor film by the surface treatment process. Further, oxygen and hydrogen that have entered the surface layer portion of the above oxide semiconductor film diffuse in the oxide semiconductor film and restore an electric resistance of the oxide semiconductor film by the annealing process. As a result, even if the fluorinated silicon nitride film is directly formed on the oxide semiconductor film, it is possible to prevent an electric resistance of the oxide semiconductor film from decreasing, and it is possible to maintain the electric resistance in a range in which the oxide semiconductor film has semiconductor characteristics.

In the surface treatment process and the film forming process, the plasma may be generated using an inductive coupling type plasma generation method in which a plasma is generated according to inductive coupling.

The fluorinated silicon nitride film may be formed as a gate insulating film or a protective film of the thin film transistor using the film forming method.

Effects of the Invention

According to the invention of claim 1, even if the fluorinated silicon nitride film is directly formed on the oxide semiconductor film, it is possible to prevent an electric resistance of the oxide semiconductor film from decreasing, and it is possible to maintain the electric resistance in a range in which the oxide semiconductor film has semiconductor characteristics.

According to the invention of claim 2, the following additional effects are obtained. That is, according to the inductive coupling type plasma generation method, since a large induced electric field can be generated in the plasma, the high density plasma is generated and a surface treatment in the surface treatment process can be efficiently performed. Also, in the film forming process, silicon tetrafluoride gas and nitrogen gas are efficiently discharged and decomposed, and the fluorinated silicon nitride film can be efficiently formed.

According to the invention of claim 3, the following additional effects are obtained. That is, while the top gate type thin film transistor has a structure in which the oxide semiconductor film and the gate insulating film are in contact with each other, when the above fluorinated silicon nitride film is forming as the gate insulating film using the above film forming method, bonding of Si—F in the film becomes strong, and fluorine atoms do not easily separate or diffuse in the oxide semiconductor film. Therefore, it is possible to obtain the thin film transistor having favorable characteristic stability.

Moreover, since the above fluorinated silicon nitride film serving as the gate insulating film has stable electrical insulating characteristics, it is possible to obtain the thin film transistor having favorable characteristic stability in this regard.

According to the invention of claim 4, the following additional effects are obtained. That is, while the bottom gate type thin film transistor has a structure in which the oxide semiconductor film and the protective film are in contact with each other, when the above fluorinated silicon nitride film is forming as the protective film using the above film forming method, bonding of Si—F in the film becomes strong, and fluorine atoms do not easily separate or diffuse in the oxide semiconductor film. Therefore, it is possible to obtain the thin film transistor having favorable characteristic stability.

Moreover, since the above fluorinated silicon nitride film serving as the protective film is dense, and diffusion of water vapor from the atmosphere into the oxide semiconductor film is effectively prevented, it is possible to obtain the thin film transistor having favorable characteristic stability in this regard.

DESCRIPTION OF THE EMBODIMENTS (1) Film Forming Method

Figure 1:
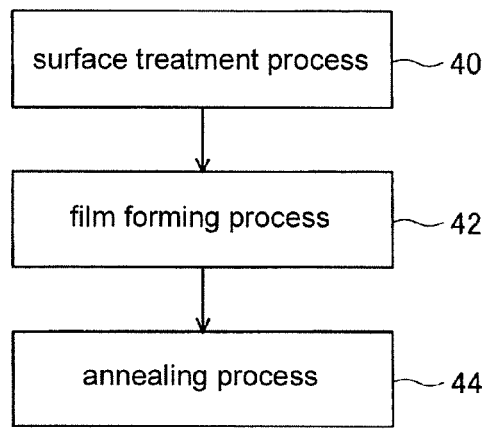
FIG. 1 is a process diagram showing a film forming method according to an embodiment of the invention.

FIG. 1 shows processes of a film forming method according to an embodiment of the invention.

The film forming method includes a surface treatment process 40, a film forming process 42 thereafter, and an annealing process 44 thereafter.

The surface treatment process 40 is a process in which a substance in which an oxide semiconductor film is formed on a substrate is prepared, a plasma containing oxygen and hydrogen is generated using a mixed gas ($O_2+H_2$) of oxygen ($O_2$) and hydrogen ($H_2$) in which a proportion of hydrogen ($H_2/(O_2+H_2)$) is 8% or less (not including 0), and a surface of the above oxide semiconductor film is treated with the plasma.

The substrate is, for example, a semiconductor substrate, a glass substrate, or a resin substrate, and the present invention is not limited thereto.

The oxide semiconductor film on the substrate is, for example, an IGZO (In—Ga—Zn—O) film, an ITZO (In—Sn—Zn—O) film, an IWZO (In—W—Zn—O) film, an IZO (In—Zn—O) film, or an ITO (In—Sn—O) film, but the present invention is not limited thereto. The oxide semiconductor film may be directly formed on a surface of the substrate or may be formed thereon with another film interposed therebetween.

A plasma treatment time is not particularly limited, and is, for example, 60 seconds or less. In this case, it is possible to improve throughput due to the short treatment time.

The film forming process 42 is a process in which a fluorinated silicon nitride film (SiN:F film) containing fluorine in the silicon nitride film is formed on the above oxide semiconductor film according to a plasma CVD method in which a plasma is generated using a raw material gas containing silicon tetrafluoride gas ($SiF_4$) and nitrogen gas ($N_2$).

For example, in the same device as the device (for example, a plasma treatment device) that performs the above surface treatment process 40, in the film forming process 42, a gas that is introduced may be switched from the above mixed gas to a raw material gas without extinguishing the plasma, following the above surface treatment process 40. Therefore, since it is possible to save time and effort of generating a plasma again after it is extinguished, it is possible to reduce a treatment time and improve throughput.

The annealing process 44 is a process in which the above substrate and the film thereon are heated (that is, annealed).

The annealing process 44 need not be performed in a vacuum atmosphere, but may be performed, for example, in air. In addition, for example, the air is introduced into a vacuum container of the above plasma treatment device and the process may be performed in the vacuum container. The heating temperature of the substrate and the like in the annealing process 44 may be in a range of, for example, 150° C. to 350° C. The heating time may be, for example, about 30 minutes to 60 minutes.

According to the film forming method, even if the fluorinated silicon nitride film is directly formed on the oxide semiconductor film, it is possible to prevent an electric resistance of the oxide semiconductor film from decreasing and the electric resistance can remain in a range in which the oxide semiconductor film has semiconductor characteristics. This is thought to be achieved by the following operations.

That is, oxygen and hydrogen appropriately enter a surface layer portion of the oxide semiconductor film by the above surface treatment process. This oxygen compensates for oxygen deficiency in the oxide semiconductor film that occurs in the film forming process. The above hydrogen eliminates (terminates) defects in the oxide semiconductor film. Further, oxygen and hydrogen that have entered the surface layer portion of the above oxide semiconductor film diffuse in the oxide semiconductor film and restore an electric resistance of the oxide semiconductor film by the above annealing process. As a result, even if the fluorinated silicon nitride film is directly formed on the oxide semiconductor film, it is possible to prevent an electric resistance of the oxide semiconductor film from decreasing, and it is possible to maintain the electric resistance in a range in which the oxide semiconductor film has semiconductor characteristics.

However, when a proportion of hydrogen in the mixed gas in the surface treatment process exceeds 8%, the electric resistance of the oxide semiconductor film is hardly restored even if the annealing process is performed. This is thought to be caused by the fact that an amount of hydrogen in the film becomes excessive, the excess hydrogen serves as a donor, and thus an electric resistance is reduced.

The above operations and effects will be further described below with reference to examples.

Figure 2:
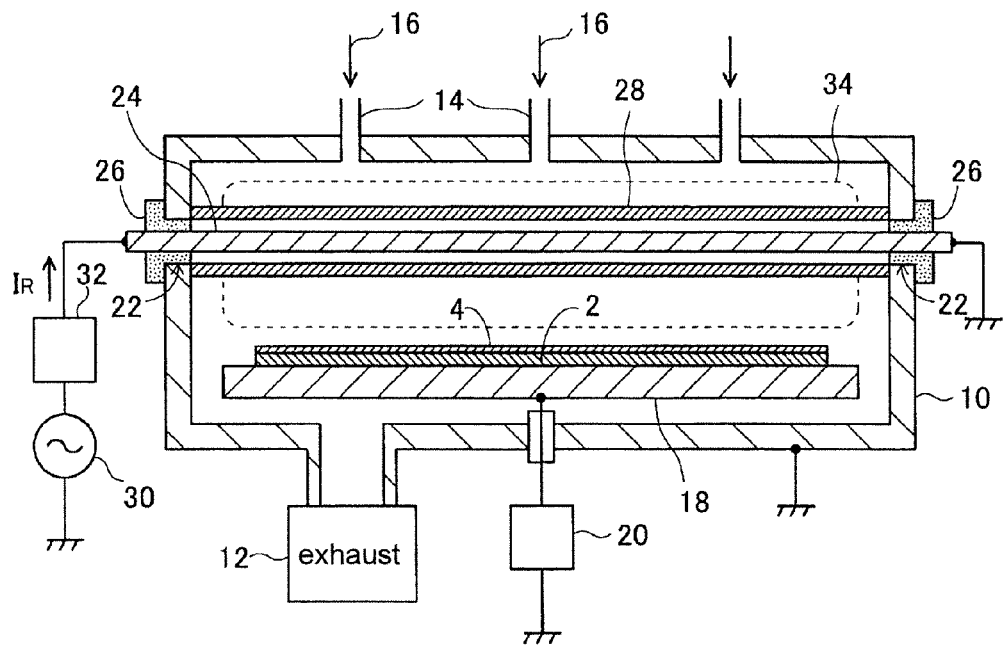
FIG. 2 is a schematic cross-sectional view showing an example of a plasma treatment device that performs an inductive coupling type plasma generation method.

In the above surface treatment process 40 and film forming process 42, the above plasma may be generated using an inductive coupling type plasma generation method in which a plasma is generated according to inductive coupling. An example of the plasma treatment device that performs an inductive coupling type plasma generation method is shown in FIG. 2.

The plasma treatment device includes a vacuum container 10 which is vacuum-exhausted by a vacuum exhaust system 12 and into which a gas 16 is introduced through a gas inlet 14, and a substrate holder 18 for holding a substrate 2 including the above oxide semiconductor film 4 is provided therein. As shown in this example, a bias voltage (for example, a negative bias voltage) may be applied to the substrate holder 18 from a bias power supply 20.

In this example, above the substrate holder 18 in the vacuum container 10, a linear high frequency antenna 24 is arranged along a surface of the substrate holder 18. The vicinities of both ends of the high frequency antenna 24 penetrate through two openings 22 provided on wall surfaces that face the vacuum container 10, and an insulating member (for example, an insulating flange) 26 is provided in the openings 22. In this example, the high frequency antenna 24 of a portion positioned inside the vacuum container 10 is covered with an insulating cover 28. Note that packing for vacuum sealing (for example, an O-ring) is provided between the insulating member 26 and the vacuum container 10, and between the high frequency antenna 24 and the insulating member 26, but these are not shown.

A high frequency current $I_R$ flows to the high frequency antenna 24 from a high frequency power supply 30 through a matching circuit 32. A frequency of the high frequency current $I_R$ is generally, for example, 13.56 MHz, but the present invention is not limited thereto.

In the plasma treatment device, when the high frequency current $I_R$ flows to the high frequency antenna 24, a high frequency magnetic field is generated around the high frequency antenna 24, and an induced electric field is generated in a direction opposite to that of the high frequency current $I_R$ accordingly. According to the induced electric field, electrons are accelerated to ionize the gas 16 in the vicinity of the high frequency antenna 24, and a plasma (that is, inductive coupling type plasma) 34 is generated in the vicinity of the high frequency antenna 24 inside the vacuum container 10. Therefore, a method of generating the plasma 34 is called an inductive coupling type plasma generation method. The above plasma 34 diffuses to the vicinity of the substrate 2 and a desired treatment can be performed on the oxide semiconductor film 4 on the substrate 2 by the plasma 34.

That is, when the above-described mixed gas of oxygen and hydrogen is used as the gas 16, the plasma 34 is generated according to the inductive coupling type plasma generation method and the surface of the oxide semiconductor film 4 can be treated with the plasma 34. That is, the above-described surface treatment process 40 can be performed. Moreover, according to the inductive coupling type plasma generation method, since a large induced electric field can be generated in the plasma 34, the high density plasma 34 is generated and a surface treatment in the surface treatment process 40 can be efficiently performed.

In addition, when a raw material gas containing the above-described silicon tetrafluoride gas and nitrogen gas is used as the gas 16, the plasma 34 is generated according to the inductive coupling type plasma generation method, and the above-described fluorinated silicon nitride film can be formed on the oxide semiconductor film 4 according to a plasma CVD method using the plasma 34. That is, the above-described film forming process 42 can be performed. Moreover, although silicon tetrafluoride gas and nitrogen gas are less likely to be discharged and decomposed than silane ($SiH_4$) and ammonia ($NH_3$) which are generally used in the related art, since a large induced electric field can be generated in the plasma 34 according to the inductive coupling type plasma generation method, silicon tetrafluoride gas and nitrogen gas can be efficiently discharged and decomposed in the film forming process 42. As a result, the high density plasma 34 is generated and the fluorinated silicon nitride film can be efficiently formed.

Examples

Figure 3:
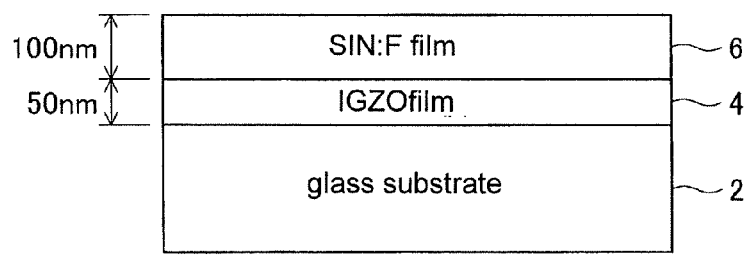
FIG. 3 is a schematic cross-sectional view showing an example of a sample in which a fluorinated silicon nitride film is formed on an oxide semiconductor film on a substrate.

As shown in FIG. 3, a substance in which an IGZO film with a thickness of 50 nm is formed as the oxide semiconductor film 4 on the glass substrate 2 is arranged inside the plasma treatment device as shown in FIG. 2, a mixed gas (a proportion of hydrogen is shown below) of oxygen ($O_2$) and hydrogen ($H_2$) is introduced as a gas, a plasma is generated according to the inductive coupling type plasma generation method, and a surface of the IGZO film is exposed to the plasma for a surface treatment. That is, the surface treatment process is performed. Treatment conditions in this case are as follows.

Proportion of hydrogen in mixed gas ($H_2/(O_2+H_2)$): 0%, 5.7%, 9.1% or 23.1%
Treatment time: 60 seconds
Vacuum container internal pressure: 4 Pa Then, in the above plasma treatment device, a gas is switched to a raw material gas (a ratio of both gases is shown below) including silicon tetrafluoride gas ($SiF_4$) and nitrogen gas ($N_2$), a plasma is generated according to the inductive coupling type plasma generation method, and a fluorinated silicon nitride film (SiN:F film) 6 is formed on the IGZO film according to a plasma CVD method using the plasma. That is, the film forming process is performed. Thus, a sample shown in FIG. 3 is obtained. Film forming conditions in this case are as follows.

Ratio of both gases in raw material gas . . . $SiF_4:N_2=1:1$
Pressure in vacuum container: 4 Pa
Film thickness of SiN:F film: 100 nm Then, the above sample is extracted in the air, heated on a hot plate, and annealed. That is, the annealing process is performed. Annealing conditions in this case are as follows.

Heating atmosphere: air
Heating temperature: 350° C.
Heating time: 1 hour

Figure 4:
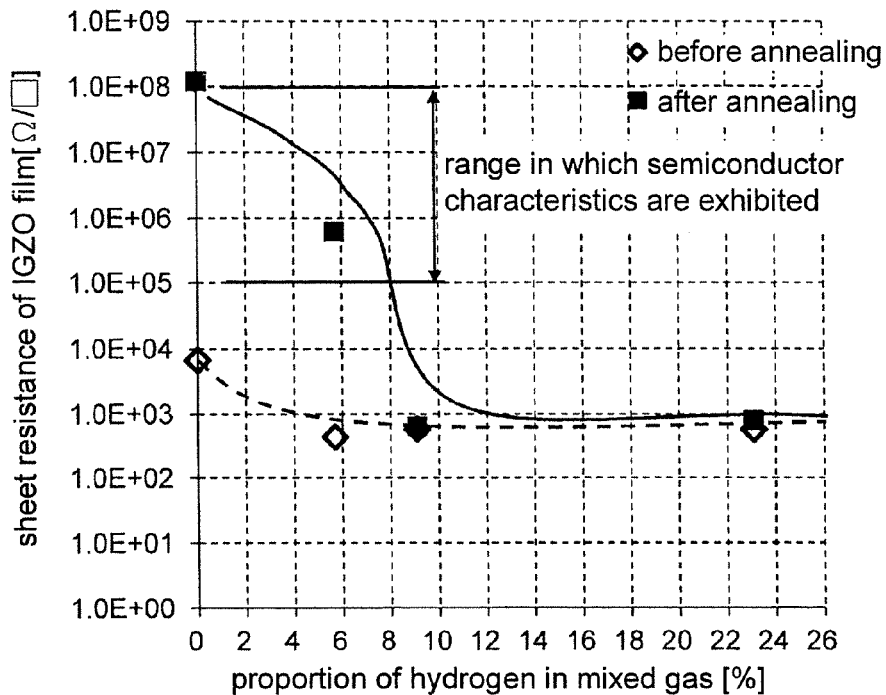
FIG. 4 is a graph showing measurement results in Table 1.

Sheet resistances of the IGZO film before and after annealing according to the hydrogen proportions in the above mixed gas are measured. The results are shown in Table 1. In addition, FIG. 4 shows a graph of measurement results in Table 1.

TABLE 1

File: 61407usf-true translation

| Proportion of hydrogen ($H_2$) | Sheet resistance of IGZO film ($\Omega$€) | |
|---|---|---|
| in mixed gas | Before annealing | After annealing |
| 23.1% | 5.82E+02 | 7.94E+02 |
| 9.1% | 5.84E+02 | 6.56E+02 |
| 5.7% | 4.47E+02 | 6.18E+05 |
| 0.0% | 6.76E+03 | 1.21E+08 |

The initial sheet resistance (that is, before the above treatment is performed) of the IGZO film is 5 E+6Ω/□. At any hydrogen proportion, the sheet resistance of the IGZO film before annealing is greatly reduced compared to the initial sheet resistance. This is thought to be caused by the fact that oxygen and/or hydrogen that have entered the surface layer portion of the IGZO film in the surface treatment process accumulates in the surface layer portion in a large amount, and thus serves as donors and greatly reduces the sheet resistance of the IGZO film.

On the other hand, the sheet resistance of the IGZO film after annealing significantly greatly increased when the hydrogen proportion is 0%. When the hydrogen proportion is 5.7%, the sheet resistance considerably increased. When the hydrogen proportion is 9.1% or more, the sheet resistance hardly increased. An increase in the sheet resistance is thought to be caused by the fact that oxygen and hydrogen that have entered the surface layer portion of the IGZO film diffuse in the IGZO film due to annealing and restore the sheet resistance of the IGZO film. When the hydrogen proportion is 9.1% or more, the sheet resistance hardly increased. This is thought to be caused by the fact that an amount of hydrogen in the IGZO film becomes excessive and the excess hydrogen serves as donors and thus reduces the sheet resistance.

A range in which the oxide semiconductor film such as an IGZO film normally has semiconductor characteristics in a thin film transistor or the like is a range in which the sheet resistance is generally 1 E+5Ω/□ to 1 E+8Ω/□. When the hydrogen proportion is 0%, the sheet resistance of the IGZO film slightly exceeds the above upper limit 1 E+8Ω/□. On the other hand, in FIG. 4, when the hydrogen proportion is 8%, the sheet resistance of the IGZO film is thought to be about the above lower limit 1 E+5Ω/□. Therefore, the hydrogen proportion in the mixed gas is preferably 8% or less (not including 0).

(2) Method of Manufacturing Thin Film Transistor

Next, a method of manufacturing a thin film transistor using the above film forming method will be exemplified.

Figure 5:
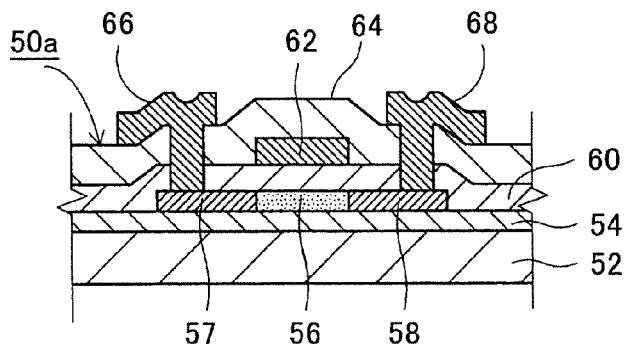
FIG. 5 is a schematic cross-sectional view showing an example of a top gate type thin film transistor.

FIG. 5 shows an example of a top gate type thin film transistor. A thin film transistor 50a has a structure in which an oxide semiconductor film 56 is formed on a substrate 52 with a diffusion preventing film 54 interposed therebetween, a gate insulating film 60 is directly formed thereon, a gate electrode 62 is formed thereon, and, in this example, a protective film 64 is additionally formed thereon. The oxide semiconductor film 56 is, for example, an oxide semiconductor film such as the IGZO film described above. This is the same as a thin film transistor 50b shown in FIG. 6.

In this example, a source region 57 and a drain region 58 are formed on both left and right sides of the oxide semiconductor film 56, and a source electrode 66 and a drain electrode 68 are connected thereto, respectively. However, a channel region remains above both left and right sides of the oxide semiconductor film 56 in place of the source region 57 and the drain region 58, and a source electrode and a drain electrode are arranged in an overlapping manner. This is the same as the thin film transistor 50b shown in FIG. 6.

While the thin film transistor 50a has a structure in which the oxide semiconductor film 56 and the gate insulating film 60 are in contact with each other, when the above fluorinated silicon nitride film is formed as the gate insulating film 60 using the above film forming method, bonding of Si—F in the film 60 becomes strong, and fluorine atoms do not easily separate or diffuse in the oxide semiconductor film 56. Therefore, it is possible to obtain the thin film transistor having favorable characteristic stability.

Moreover, since the above fluorinated silicon nitride film serving as the gate insulating film 60 has stable electrical insulating characteristics, it is possible to obtain the thin film transistor having favorable characteristic stability in this regard.

Figure 6:
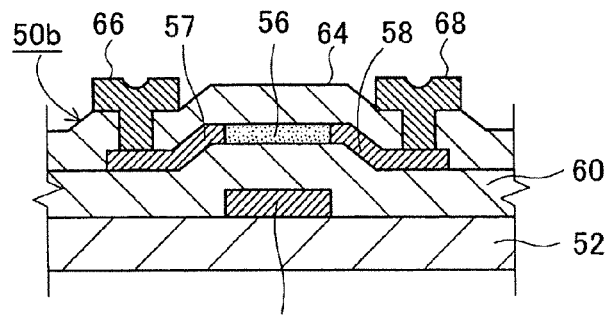
FIG. 6 is a schematic cross-sectional view showing an example of a bottom gate type thin film transistor.

FIG. 6 shows an example of a bottom gate type thin film transistor. The thin film transistor 50b has a structure in which the gate electrode 62 is formed on the substrate 52, the gate insulating film 60 is formed thereon, the oxide semiconductor film 56 is formed thereon, and the protective film 64 is directly formed thereon. A structure around a source and a drain is the same as in FIG. 5.

While the thin film transistor 50b has a structure in which the oxide semiconductor film 56 and the protective film 64 are in contact with each other, when the above fluorinated silicon nitride film is formed as the protective film 64 using the above film forming method, bonding of Si—F in the film 64 becomes strong, and fluorine atoms do not easily separate or diffuse in the oxide semiconductor film 56. Therefore, it is possible to obtain the thin film transistor having favorable characteristic stability.

Moreover, since the above fluorinated silicon nitride film serving as the protective film 64 is dense, and diffusion of water vapor from the atmosphere into the oxide semiconductor film 56 is effectively prevented, it is possible to obtain the thin film transistor having favorable characteristic stability in this regard.

2 Substrate
4 Oxide semiconductor film
6 Fluorinated silicon nitride film
16 Gas
24 High frequency antenna
30 High frequency power supply
34 Plasma
40 Surface treatment process
42 Film forming process
44 Annealing process
50a, 50b Thin film transistor
52 Substrate
56 Oxide semiconductor film
60 Gate insulating film
62 Gate electrode

What is claimed is:
1. A film forming method comprising:
performing a surface treatment process of preparing a substance in which an oxide semiconductor film is formed on a substrate, generating a plasma using a mixed gas of oxygen and hydrogen in which a proportion of hydrogen is 8% or less (not including 0), and treating a surface of the oxide semiconductor film with the plasma;
then performing a film forming process of forming a fluorinated silicon nitride film containing fluorine in a silicon nitride film on the oxide semiconductor film by a plasma CVD method in which a plasma is generated using a raw material gas containing silicon tetrafluoride gas and nitrogen gas; and then performing an annealing process of heating the substrate and the film thereon.

2. The film forming method according to claim 1, wherein in the surface treatment process and the film forming process, the plasma is generated using an inductive coupling type plasma generation method in which a plasma is generated by inductive coupling.

3. A method of manufacturing a thin film transistor, comprising:

forming an oxide semiconductor film on a substrate, forming a gate insulating film on the oxide semiconductor film, and forming a gate electrode on gate insulating film to form a structure of a top gate type thin film transistor, wherein a fluorinated silicon nitride film as the gate insulating film is formed using the film forming method according to claim 1.

4. A method of manufacturing a thin film transistor, comprising:

forming a gate electrode on a substrate, forming a gate insulating film on the gate electrode, and forming an oxide semiconductor film on gate insulating film, and forming a protective film on the oxide semiconductor film to form a structure of a bottom gate type thin film transistor, wherein a fluorinated silicon nitride film as the protective film is formed using the film forming method according to claim 1.

5. A method of manufacturing a thin film transistor, comprising:

forming an oxide semiconductor film on a substrate, forming a gate insulating film on the oxide semiconductor film, and forming a gate electrode on gate insulating film to form a structure of a top gate type thin film transistor, wherein a fluorinated silicon nitride film as the gate insulating film is formed using the film forming method according to claim 2.

6. A method of manufacturing a thin film transistor, comprising:

forming a gate electrode on a substrate, forming a gate insulating film on the gate electrode, and forming an oxide semiconductor film on gate insulating film, and forming a protective film on the oxide semiconductor film to form a structure of a bottom gate type thin film transistor, wherein a fluorinated silicon nitride film as the protective film is formed using the film forming method according to claim 2.

* * * * *